United States Patent
Rossi et al.

(10) Patent No.: US 8,872,311 B2
(45) Date of Patent: Oct. 28, 2014

(54) SEMICONDUCTOR DEVICE AND A METHOD OF MANUFACTURE THEREFOR

(75) Inventors: Nace Rossi, Singapore (SG); Alvaro Maury, Pulau Pinang (MY)

(73) Assignee: Agere Systems Inc., Allentown, PA (US)

( * ) Notice: Subject to any disclaimer, the term of this patent is extended or adjusted under 35 U.S.C. 154(b) by 2284 days.

(21) Appl. No.: 10/778,453

(22) Filed: Feb. 13, 2004

(65) Prior Publication Data
US 2005/0179115 A1  Aug. 18, 2005

(51) Int. Cl.
*H01L 23/58* (2006.01)
*H01L 21/768* (2006.01)
*H01L 21/8238* (2006.01)
*H01L 29/66* (2006.01)

(52) U.S. Cl.
CPC .... *H01L 21/76831* (2013.01); *H01L 21/76832* (2013.01); *H01L 21/76897* (2013.01); *H01L 21/823871* (2013.01); *H01L 21/76895* (2013.01); *H01L 29/6659* (2013.01)
USPC ...... 257/639; 257/646; 257/649; 257/E27.06; 257/E29.255

(58) Field of Classification Search
USPC ......... 257/288, 368, 382, 410, 411, 646, 649, 257/774, E29.255, E27.06, 639, E21.266
See application file for complete search history.

(56) References Cited

U.S. PATENT DOCUMENTS

| | | | | |
|---|---|---|---|---|
| 5,580,811 | A * | 12/1996 | Kim | 438/253 |
| 6,242,781 | B1 * | 6/2001 | Batra et al. | 257/380 |
| 6,316,348 | B1 * | 11/2001 | Fu et al. | 438/636 |
| 6,348,709 | B1 * | 2/2002 | Graettinger et al. | 257/311 |
| 6,362,012 | B1 * | 3/2002 | Chi et al. | 438/3 |
| 6,420,777 | B2 * | 7/2002 | Lam et al. | 257/640 |
| 6,548,418 | B2 * | 4/2003 | Lam et al. | 438/723 |
| 6,566,258 | B1 | 5/2003 | Dixit et al. | |
| 6,870,230 | B2 * | 3/2005 | Matsuda et al. | 257/365 |
| 2001/0036730 | A1 * | 11/2001 | Kim | 438/689 |
| 2002/0192868 | A1 * | 12/2002 | Kim | 438/112 |
| 2003/0207586 | A1 * | 11/2003 | Lam et al. | 438/723 |
| 2004/0043542 | A1 * | 3/2004 | Park et al. | 438/142 |

* cited by examiner

*Primary Examiner* — Minh-Loan Tran
*Assistant Examiner* — Fazli Erdem (57) ABSTRACT

The present invention provides a semiconductor device, a method of manufacture therefor, and an integrated circuit including the semiconductor device. The semiconductor device, in one particularly advantageous embodiment, includes a multi layer etch stop located over a substrate, wherein the multi layer etch stop has a first insulative layer and a second silicon-rich nitride layer located over the first insulative layer. Located over the multi layer etch stop is a dielectric layer having an opening formed therein that extends through at least a portion of the multi layer etch stop. A conductive plug is typically located within the opening, wherein an insulative spacer is located between the conductive plug and the second silicon-rich nitride layer.

7 Claims, 9 Drawing Sheets

SEMICONDUCTOR DEVICE AND A METHOD OF MANUFACTURE THEREFOR

TECHNICAL FIELD OF THE INVENTION

The present invention is directed, in general, to a semiconductor device and, more specifically, to a semiconductor device having an insulative spacer, a method of manufacture therefor and an integrated circuit including the same.

BACKGROUND OF THE INVENTION

Integrated circuits are mass produced by fabricating hundreds of identical circuit patterns on a single semiconductor wafer. One of the many different processes repeated over and over in manufacturing these integrated circuits is that of using a mask and etchant for forming a particular feature. In such a mask and etching process, a photo mask containing the pattern of the structure to be fabricated is created, then, after formation of a material layer within which the feature is to be formed, the material layer is coated with a light-sensitive material called photoresist or resist. The resist-coated material layer is then exposed to ultraviolet light through the mask, thereby transferring the pattern from the mask to the resist. The wafer is then etched to remove the material layer unprotected by the resist, and then the remaining resist is stripped. This masking process permits specific areas of the material layer to be formed to meet the desired device design requirements.

In the etching process described above, it is important that the etching selectively remove the unwanted material and that the material underlying the material layer is not excessively damaged. A common way to accomplish this is to deposit or otherwise form an etch stop layer on the wafer prior to formation of the material layer. Such etch stop layers are commonly made of a material that is resistant to the particular etching process used.

In the integrated circuit fabrication art, the property of being resistant to an etching process is called the "selectivity" of a material. The selectivity of a particular material in a particular etching process is usually defined as the etching rate of the material to be removed divided by the etching rate of the particular material. Thus, a material that is highly resistant to an etch is said to have a high selectivity.

One of the more common etch stop layers currently used in the fabrication of integrated circuits is a single layer of silicon nitride ($Si_3N_4$). Unfortunately, $Si_3N_4$ does not provide the desired amount of selectivity required in certain of today's desired applications. The industry has attempted to use a single layer of silicon-rich nitride ($Si_xN_y$, where the ratio of x:y is equal to or greater than 1.0) to increase the selectivity required for these applications, however, it has done so with limited success. Interestingly, silicon-rich nitride is somewhat conductive as compared to conventional silicon nitride, and thereby introduces certain undesirable electrical characteristics, such as source-to-drain and plug-to-plug leakage.

Accordingly, what is needed in the art is an etch stop that does not experience, or in another aspect introduce, the problems that arise with the use of the prior art etch stops.

SUMMARY OF THE INVENTION

To address the above-discussed deficiencies of the prior art, the present invention provides a semiconductor device, a method of manufacture therefor, and an integrated circuit including the semiconductor device. The semiconductor device, in one particularly advantageous embodiment, includes a multi layer etch stop located over a substrate, wherein the multi layer etch stop has a first insulative layer and a second silicon-rich nitride layer located over the first insulative layer. Located over the multi layer etch stop is a dielectric layer having an opening formed therein that extends through at least a portion of the multi layer etch stop. A conductive plug is typically located within the opening, wherein an insulative spacer is located between the conductive plug and the second silicon-rich nitride layer.

The method for manufacturing the semiconductor device, among possible other steps, includes creating a multi layer etch stop over a substrate, wherein the multi layer etch stop has a first insulative layer and a second silicon-rich nitride layer located over the first insulative layer, and then placing a dielectric layer over the multi layer etch stop, the dielectric layer having an opening formed therein that extends through at least a portion of the multi layer etch stop. The method further includes locating a conductive plug within the opening and forming an insulative spacer between the conductive plug and the second silicon-rich nitride layer.

As mentioned directly above, the present invention further includes an integrated circuit including the aforementioned semiconductor device. Without limitation, the integrated circuit may include 1) transistors located over a semiconductor substrate, 2) a multi layer etch stop located over the transistors and the semiconductor substrate, wherein the multi layer etch stop has a first insulative layer and a second silicon-rich nitride layer located over the first insulative layer, 3) an interlevel dielectric layer located over the multi layer etch stop, the interlevel dielectric layer having openings formed therein for contacting the transistors, the openings extending through at least a portion of the multi layer etch stop, 4) conductive plugs located within the openings, and 5) insulative spacers located between the conductive plugs and the second silicon-rich nitride layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
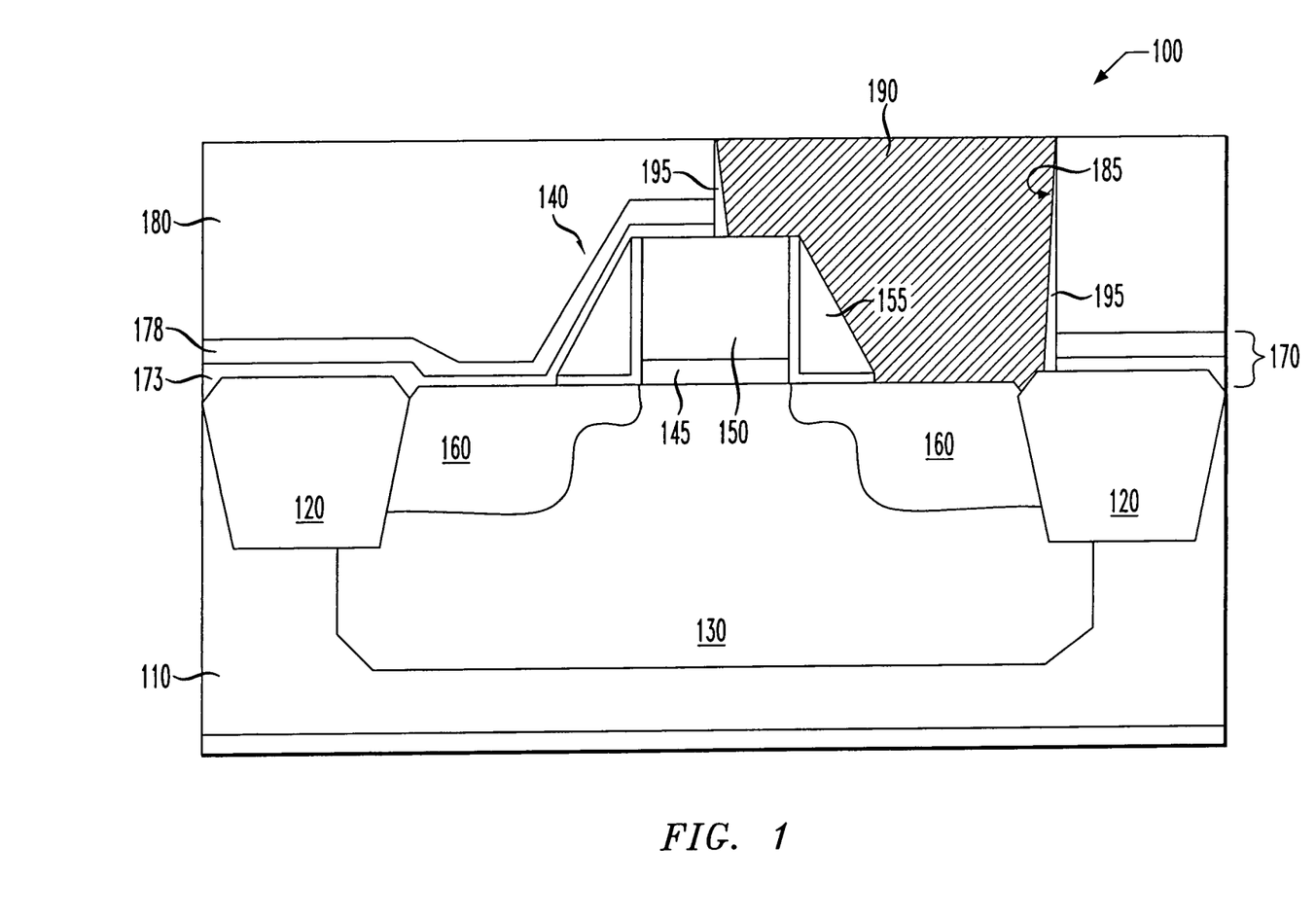
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a semiconductor substrate 110. Located within the semiconductor substrate 110 in the embodiment of FIG. 1 are isolation structures 120. In this particular embodiment, the isolation structures 120 are shallow trench isolation (STI) structures, however, it should be noted that other isolation structures are within the broad scope of the present invention.

Further located within the semiconductor substrate 110 and between the isolation structures 120 in the embodiment of FIG. 1 is a conventional well region 130. Additionally, located over the semiconductor substrate 110 and well region 130 is a gate structure 140. The gate structure 140 illustrated in FIG. 1 includes a gate oxide 145 located over the semiconductor substrate 110, as well as a gate electrode 150 located over the gate oxide 145. Flanking both sides of the gate electrode 150 and gate oxide 145 of the gate structure 140 depicted in FIG. 1, are gate sidewall spacers 155.

The semiconductor device 100 illustrated in FIG. 1 further includes conventional source/drain regions 160 located within the semiconductor substrate 110. The source/drain regions 160, as is common, may each include a lightly doped extension implant as well as a higher doped source/drain implant. While not illustrated in FIG. 1, other elements, such as halo implants, could be included within the well region 130 of the semiconductor device 100.

Located over the semiconductor substrate 110, and in this embodiment over a portion of the gate structure 140, is a multi layer etch stop 170. The multi layer etch stop 170, as shown, includes a first insulative layer 173, and a second silicon-rich nitride layer 178 located over the first insulative layer 173. Conventionally located over the multi layer etch stop 170 is a dielectric layer 180. The dielectric layer 180, in the embodiment of FIG. 1, includes an opening 185 formed therein that extends through at least a portion of the multi layer etch stop 170.

Formed within the opening 185 in the dielectric layer 180 is a conductive plug 190. The conductive plug 190, in this instance, provides electrical connection to the gate electrode 150 and a source/drain region 160. Uniquely positioned along the sidewalls of the opening 185 and between the conductive plug 190 and the second silicon-rich nitride layer 178, are insulative spacers 195.

The insulative spacers 195, among other materials, may comprise silicon nitride. Additionally, the insulative spacers 195 may have an exemplary maximum thickness ranging from about 10 nm to about 30 nm. Also, as shown in FIG. 1, the thickness of the insulative spacers 195 may taper down as they approach the second silicon-rich nitride layer 178. While specifics have been given detailing the exemplary materials, thicknesses and shapes for the insulative spacers 195, such specifics should not be construed to limit the insulative spacers 195 what-so-ever.

In contrast to the prior art semiconductor devices, the semiconductor device 100 illustrated in FIG. 1 benefits from the increased etch selectivity of the second silicon-rich nitride layer 178, without experiencing its drawbacks. Namely, the first insulative layer 173 electrically insulates the second silicon-rich nitride layer 178 from the semiconductor substrate 110 and gate structure 140, thereby reducing the danger of gate to source/drain leakage through the second silicon-rich nitride layer 178. Additionally, the insulative spacers 195 electrically insulate the second silicon-rich nitride layer 178 from the conductive plug 190, thereby reducing the danger of plug-to-plug leakage through the second silicon-rich nitride layer 178.

Figure 2:
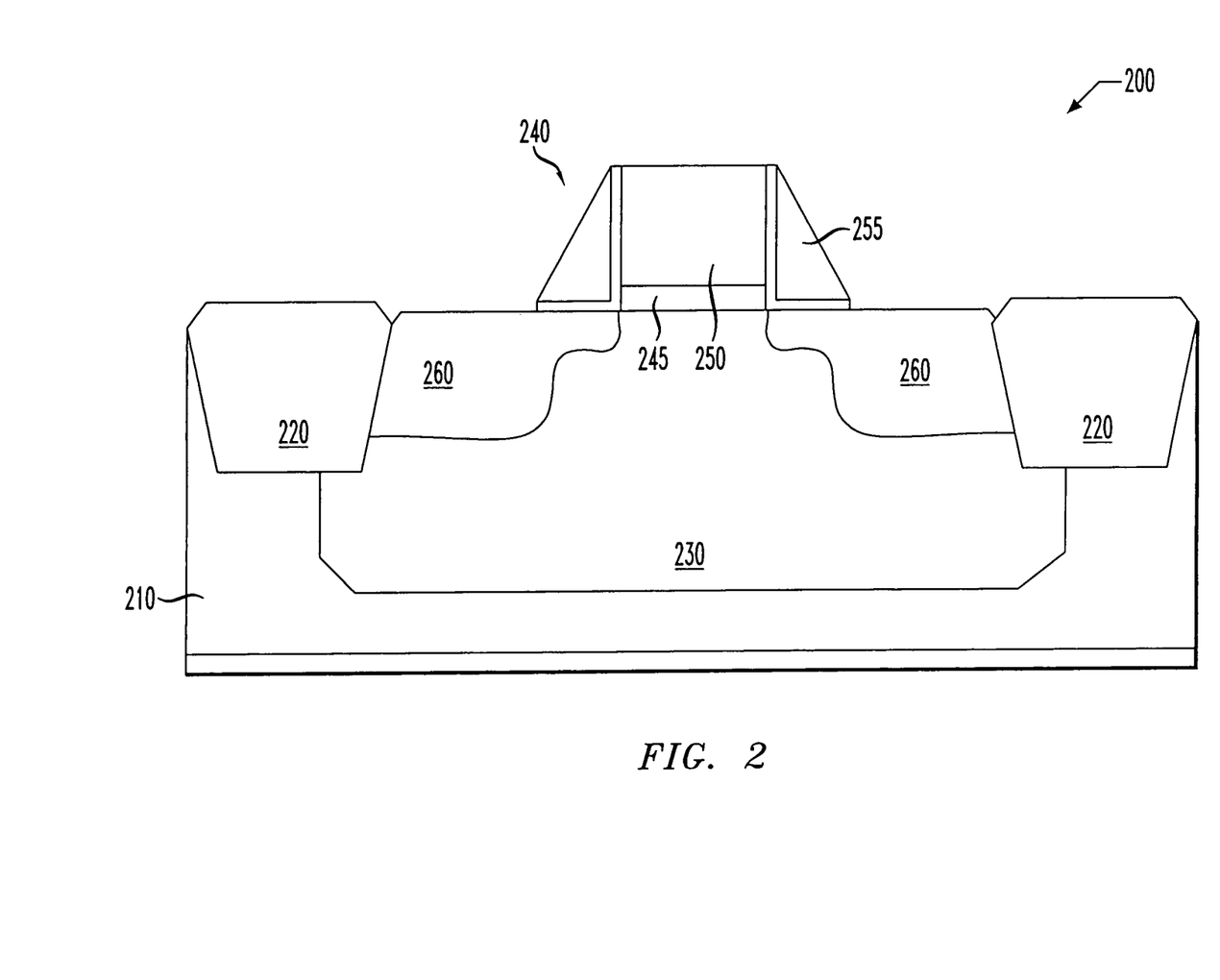
FIG. 2 illustrates a cross-sectional view of a partially completed semiconductor device.

Turning now to FIGS. 2-8, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200. The partially completed semiconductor device 200 includes a semiconductor substrate 210. The semiconductor substrate 210 may, in an exemplary embodiment, be any layer located in the partially completed semiconductor device 200, including a wafer itself or a layer located above the wafer (e.g., epitaxial layer). In the embodiment illustrated in FIG. 2, the semiconductor substrate 210 is a P-type semiconductor substrate; however, one skilled in the art understands that the semiconductor substrate 210 could be an N-type substrate without departing from the scope of the present invention.

Located within the semiconductor substrate 210 in the embodiment shown in FIG. 2 are isolation regions 220. The isolation regions 220 isolate the semiconductor device 200 from other devices located proximate thereto. As those skilled in the art understand the various steps used to form these conventional isolation regions 220, no further detail will be given.

In the illustrative embodiment of FIG. 2, also formed within the semiconductor substrate 210 is a well region 230. The well region 230, in light of the P-type semiconductor substrate 210, would more than likely contain an N-type dopant. For example, the well region 230 would likely be doped with an N-type dopant dose ranging from about 1E13 atoms/cm$^2$ to about 1E14 atoms/cm$^2$ and at a power ranging from about 100 keV to about 500 keV. What generally results is the well region 230 having a peak dopant concentration ranging from about 5E17 atoms/cm$^3$ to about 1E19 atoms/cm$^3$.

Further located over the semiconductor substrate 210 and between the isolation structures 220 is a conventional gate structure 240. As is illustrated in FIG. 2, the gate structure 240 includes a gate oxide 245 and a gate electrode 250. Also included within the gate structure 240, and in this embodiment flanking both sides of the gate oxide 245 and gate electrode 250, are gate sidewall spacers 255. As the gate structure 240 is conventional, those skilled in the art understand the standard steps used for its manufacture, including blanket depositing both a gate oxide layer and a gate electrode layer and subsequently using photolithography to define the gate structure 240.

Located within the semiconductor substrate 210, and particularly the well region 230 are conventional source/drain regions 260. The conventional source/drain regions 260, as is common, each include a lightly doped extension implant and a heavily doped source/drain implant. The lightly doped extension implants may be conventionally formed and generally have a peak dopant concentration ranging from about 1E17 atoms/cm$^3$ to about 2E20 atoms/cm$^3$. Similarly, the heavily doped source/drain implants may also be conventionally formed and have a peak dopant concentration ranging from about 1E18 atoms/cm$^3$ to about 1E21 atoms/cm$^3$. As is standard in the industry, both the lightly doped and heavily doped implants have a dopant type opposite to that of the well region 230 they are located within. Accordingly, in the illustrative embodiment shown in FIG. 2, both the lightly doped and heavily doped implants are doped with a P-type dopant.

Figure 3:
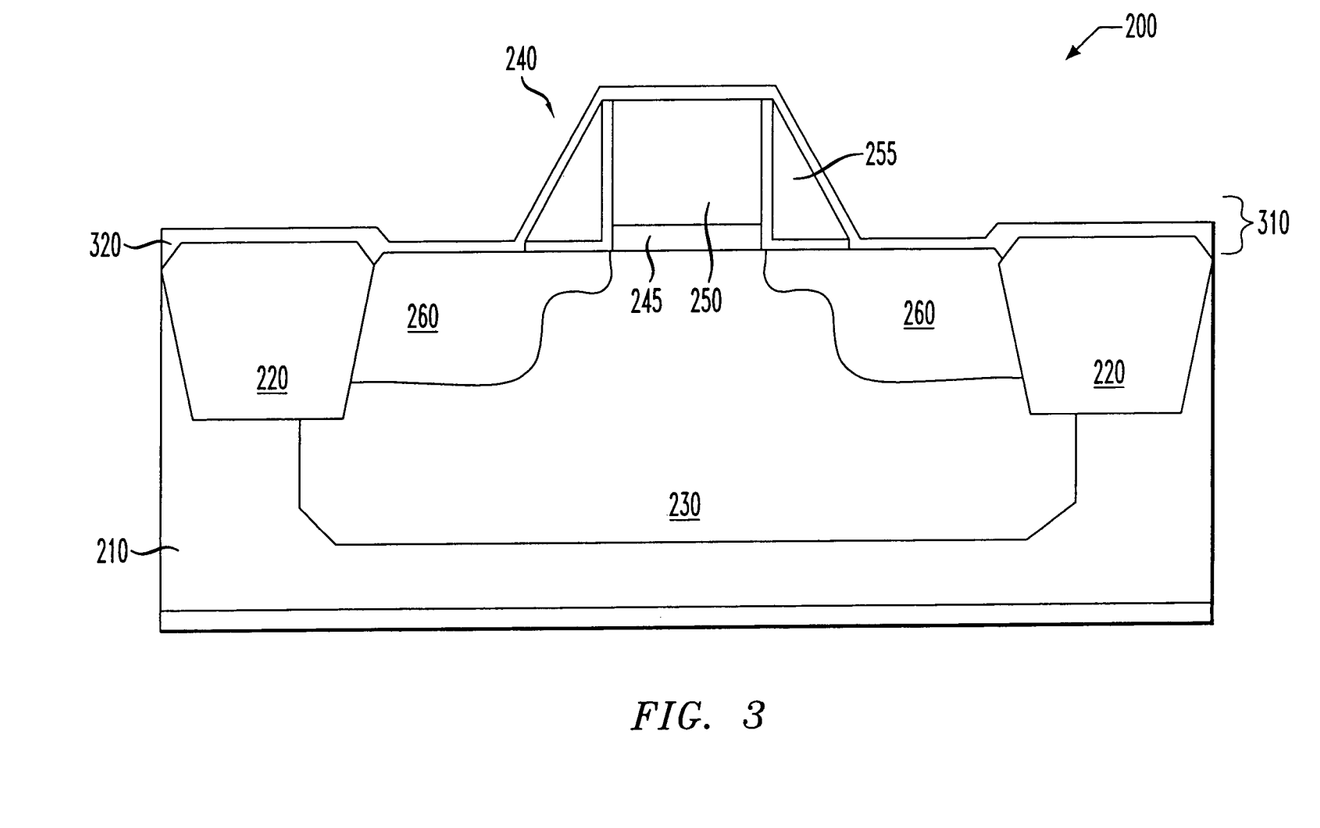
FIG. 3 illustrates a cross-sectional view of the partially completed semiconductor device illustrated in FIG. 2 after beginning the formation of a multi layer etch stop by forming a blanket layer of insulative material over the semiconductor substrate and gate structure.

Turning now to FIG. 3, illustrated is a cross-sectional view of the partially completed semiconductor device 200 illustrated in FIG. 2 after beginning the formation of a multi layer etch stop 310 by forming a blanket layer of insulative material 320 over the semiconductor substrate 210 and gate structure 240. The blanket layer of insulative material 320, such as silicon nitride or another similar material, may advantageously have a thickness ranging from about 5 nm to about 50 nm, with a preferred thickness ranging from about 10 nm to about 20 nm. In the instance where silicon nitride is used as the blanket layer of insulative material 320, it is beneficial for the blanket layer of insulative material 320 to have a $Si_x$ to $N_y$ ratio (x:y) of 0.75 or less. For example, it has been observed that $Si_3N_4$ provides the sufficient amount of insulation required by the present invention.

The blanket layer of insulative material 320 may be formed using a conventional deposition process. In one exemplary embodiment of the present invention, the blanket layer of insulative material 320 is deposited using a low pressure chemical vapor deposition (LPCVD) process using a range of different gasses, flow rates, pressures, temperatures and energies. For example, it is believed that $NH_3$ and $SiH_2Cl_2$ gases might be introduced at flow rates ranging from about 300 sccm to about 700 scam, and from about 50 scam to about 150 scam, respectively, and at a pressure ranging from about 0.2 Torr to about 0.4 Torr and a temperature ranging from about 700° C. to about 760° C. to produce a suitable $Si_3N_4$ insulative layer. Other deposition conditions, however, could be used to form different types or stoichiometries of suitable materials. For example, to make the layer more silicon rich, the flow rate of the $SiH_2Cl_2$ would be increased and the flow rate of the $NH_3$ would be decreased.

Figure 4:
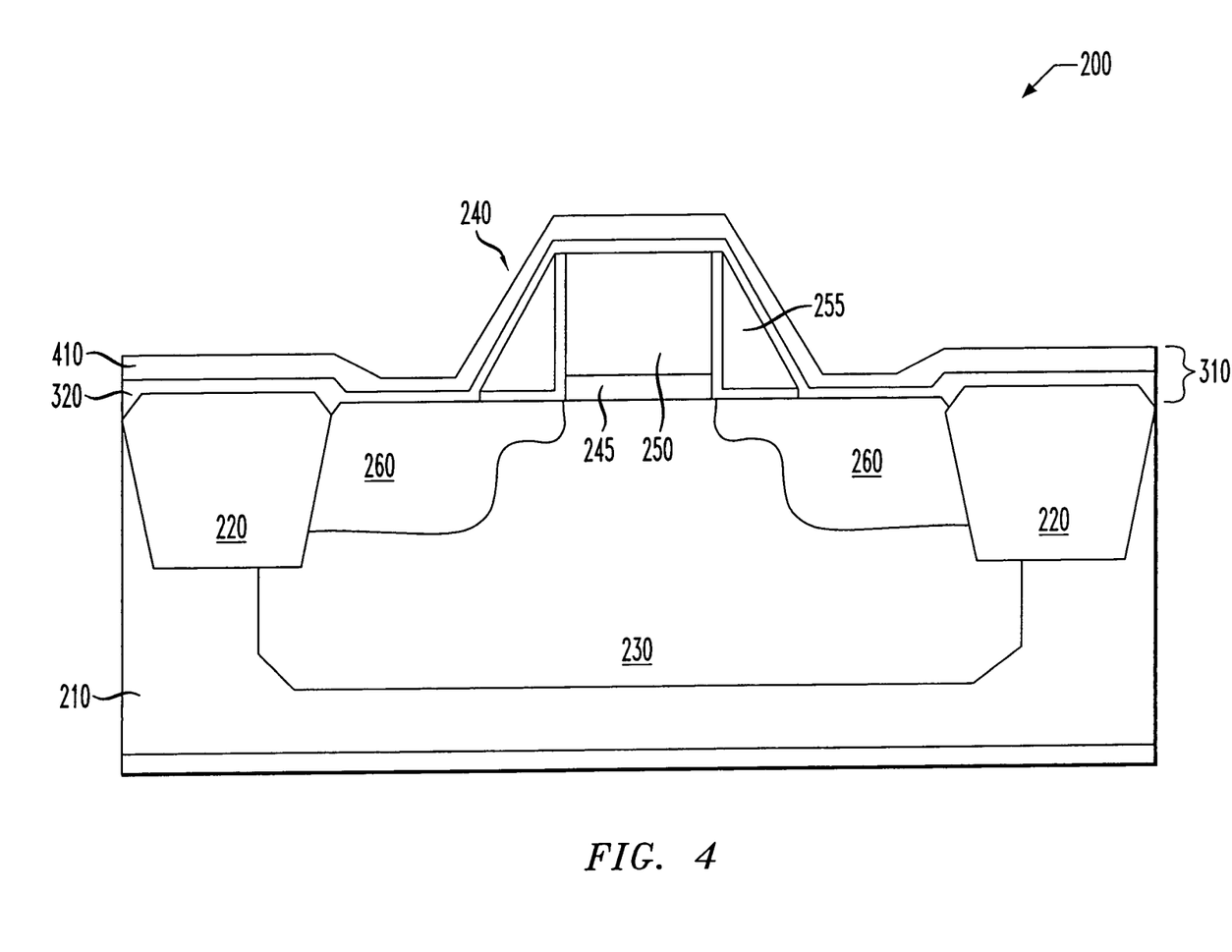
FIG. 4 illustrates a cross-sectional view of the partially completed semiconductor device illustrated in FIG. 3 after completing the multi layer etch stop by forming a silicon-rich nitride layer over the blanket layer of insulative material.

Turning now to FIG. 4, illustrated is a cross-sectional view of the partially completed semiconductor device 200 illustrated in FIG. 3 after completing the multi layer etch stop 310 by forming a silicon-rich nitride layer 410 over the blanket layer of insulative material 320. The silicon-rich nitride layer 410, by definition, has a $Si_x$ to $N_y$ ratio (x:y) of greater than about 0.85. The increased amount of silicon in the silicon-rich nitride layer 410, as compared to a standard silicon nitride etch stop layer, provides an enhanced nitride/oxide selectivity during contact etch. That said, the silicon-rich nitride layer 410 may comprise the whole range of silicon-rich nitride films, including pure silicon, while staying within the scope of the present invention.

The silicon-rich nitride layer 410 may advantageously have a thickness ranging from about 5 nm to about 60 nm, with a preferred thickness ranging from about 10 nm to about 30 nm, among others. Similar to the blanket layer of insulative material 320, the silicon-rich nitride layer 410 may be formed using a conventional deposition process, such as the aforementioned LPCVD process. Often, the blanket layer of insulative material 320 and the silicon-rich nitride layer 410 are formed in the same deposition chamber, altering only the deposition gasses, flow rates, pressures, temperatures, energies, etc. to form the different layers. In one exemplary embodiment of the present invention, the silicon-rich nitride layer 410 is deposited using $NH_3$ and $SiH_2Cl_2$ gases. These gasses might be introduced at flow rates ranging from about 300 sccm to about 700 sccm, and from about 50 sccm to about 150 sccm, respectively, and at a pressure ranging from about 0.2 Torr to about 0.4 Torr and a temperature ranging from about 700° C. to about 760° C. to produce a suitable $Si_3N_4$ insulative layer. The ratio of the flow rate of the $SiH_2Cl_2$ to the $NH_3$ for the deposition of the silicon-rich nitride layer 410 is higher than that same ratio for the deposition of the blanket layer of insulative material 320. As a result, the silicon-rich nitride layer 410 results. It should be noted that other deposition conditions could be used to form different stoichiometries of the silicon-rich nitride layer 410.

Figure 5:
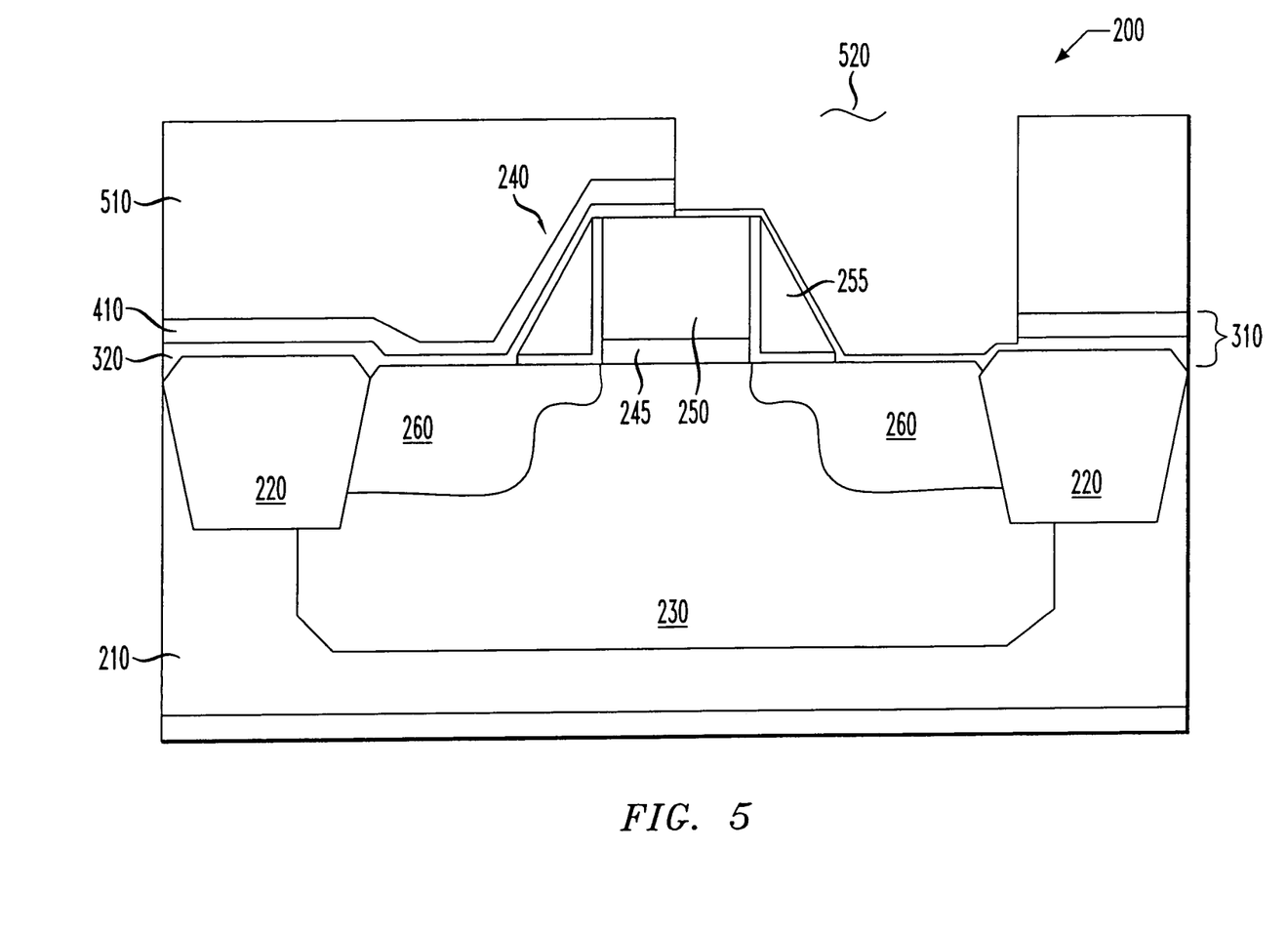
FIG. 5 illustrates a cross-sectional view of the partially completed semiconductor device illustrated in FIG. 4 after forming a conventional dielectric layer over the multi layer etch stop, and creating an opening within the dielectric layer.

Turning now to FIG. 5, illustrated is a cross-sectional view of the partially completed semiconductor device 200 illustrated in FIG. 4 after forming a conventional dielectric layer 510 over the multi layer etch stop 310, and creating an opening 520 within the dielectric layer 510. The dielectric layer 510 may be a conventional dielectric layer, such as an oxide, and may be formed using conventional techniques. For this reason its manufacture will not be discussed any further.

As shown in the embodiment of FIG. 5, the opening 520 extends through at least a portion of the multi layer etch stop 310. It is desirable, at least at this stage, that the etchant used to form the opening 520 not over etch entirely through the multi layer etch stop 310. If the etchant were to over etch entirely through the multi layer etch stop 310 and into the gate electrode 250, gate sidewall spacers 255, or source/drain regions 260, the integrity of the semiconductor device 200 might be compromised. Fortunately, as shown, the etchant used to etch the opening 520 has a high degree of selectivity to the multi layer etch stop 310, rather than the dielectric layer 510. This high degree of selectivity is increased with the use of the silicon-rich nitride portion 410 of the multi layer etch stop 310. Nonetheless, the etchant still tends to etch into the multi layer etch stop 310 to some degree, as shown in FIG. 5.

Figure 6:
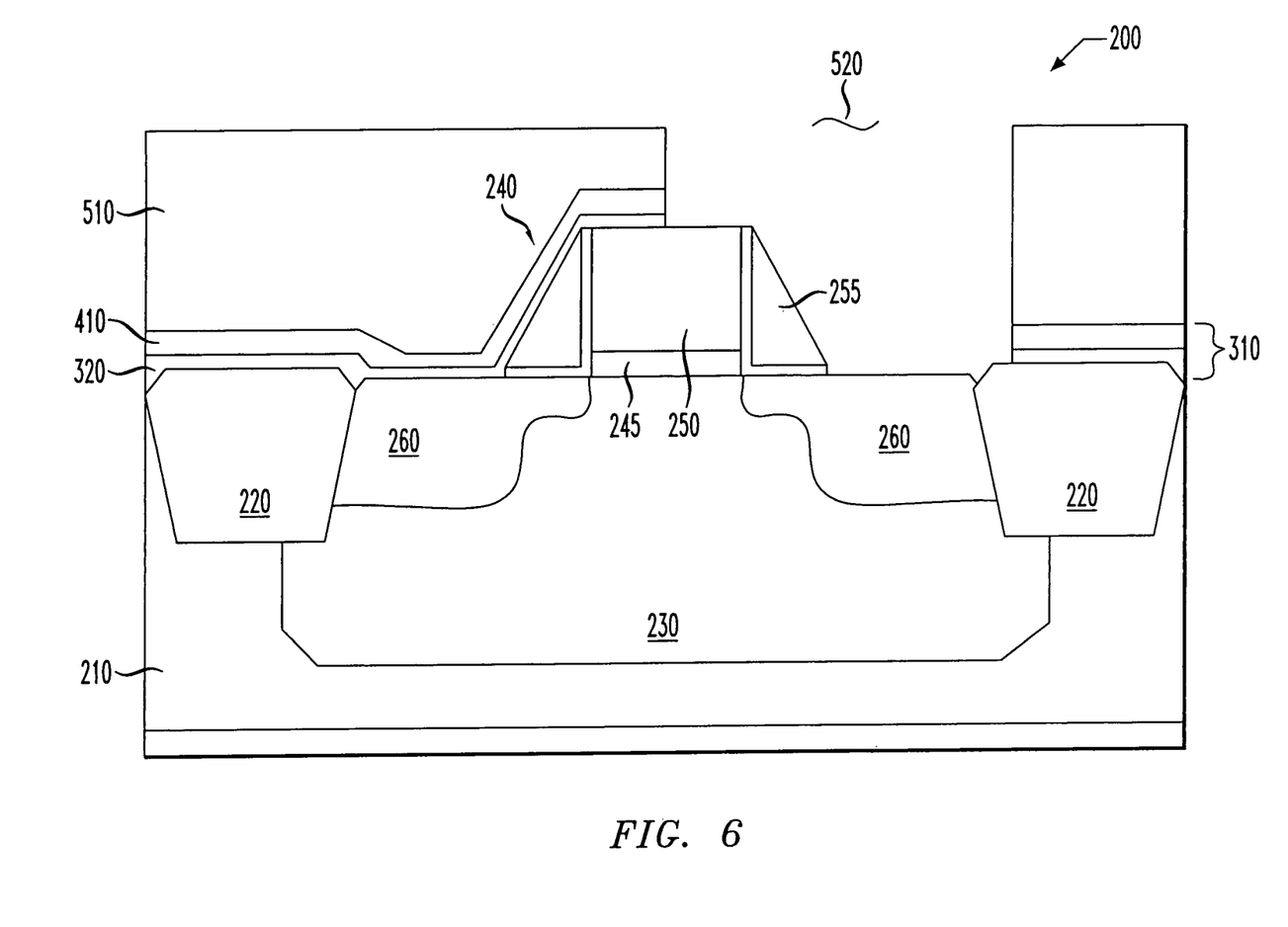
FIG. 6 illustrates a cross-sectional view of the partially completed semiconductor device illustrated in FIG. 5 after removing any remaining multi layer etch stop exposed by the opening.

Turning now to FIG. 6, illustrated is a cross-sectional view of the partially completed semiconductor device 200 illustrated in FIG. 5 after removing any remaining multi layer etch stop 310 exposed by the opening 520. Particularly, the multi layer etch stop 310 is removed from the exposed regions of the semiconductor substrate 210 and gate structure 240. A conventional blanket nitride etch, or other similar etch, could be used to remove those exposed portions. As those skilled in the art are aware, the blanket nitride etch can be tailored in such a way as to substantially reduce any damage that might be caused to the underlying layers of the remaining multi layer etch stop 310.

Figure 7:
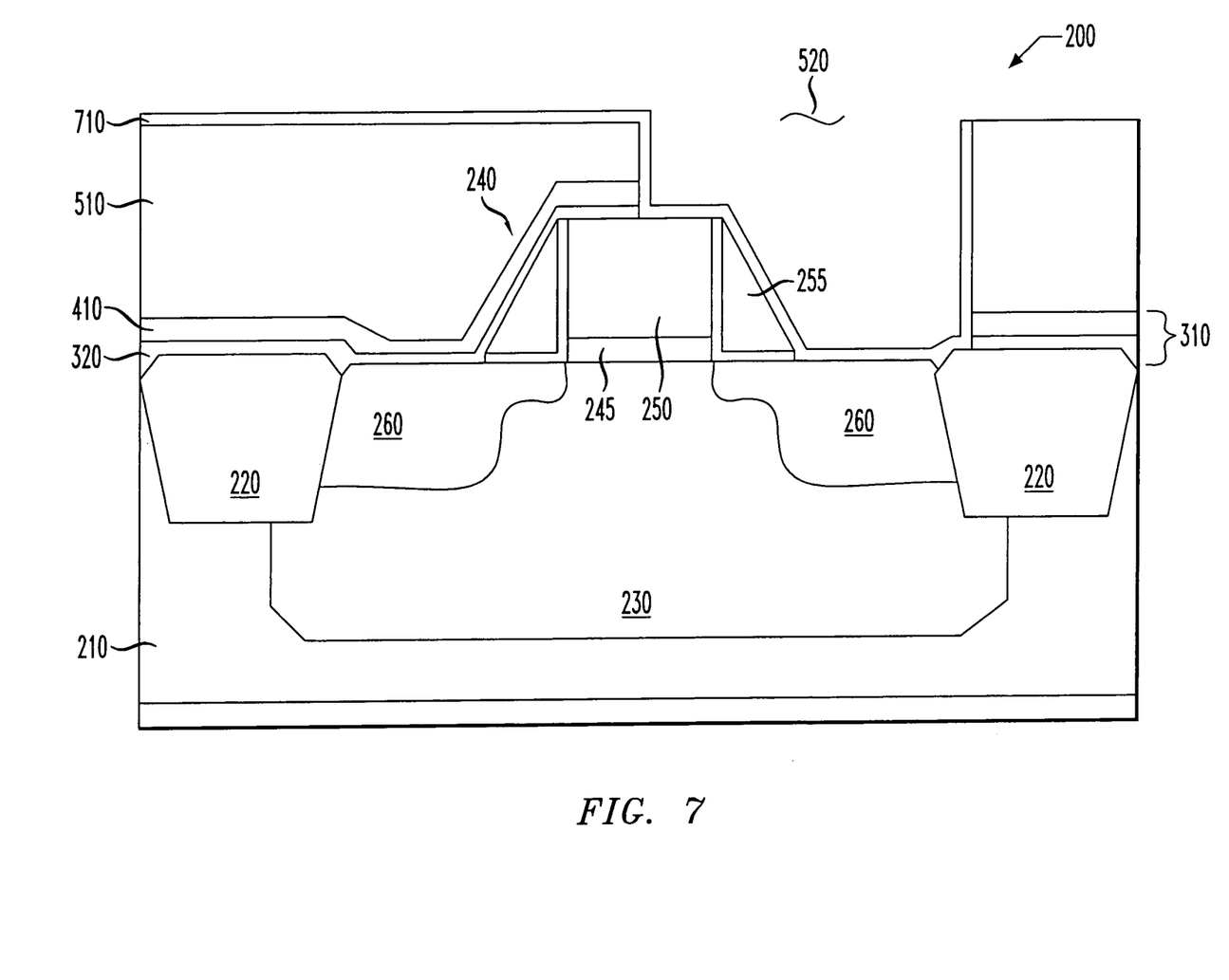
FIG. 7 illustrates a cross-sectional view of the partially completed semiconductor device illustrated in FIG. 6 after depositing an insulative layer along the sidewalls of the opening.

Turning now to FIG. 7, illustrated is a cross-sectional view of the partially completed semiconductor device 200 illustrated in FIG. 6 after depositing an insulative layer 710 along the sidewalls of the opening 520. In the particular embodiment shown, the insulative layer 710 is also located along the upper surface of the dielectric layer 510 and the exposed portion of the semiconductor substrate 210. The insulative layer 710, which may comprise silicon nitride or another similar material, may advantageously have a thickness ranging from about 5 nm to about 60 nm, with a preferred thickness ranging from about 10 nm to about 30 nm. In the instance where silicon nitride is used as the insulative layer 710, it is beneficial for the insulative layer 710 to have a $Si_x$ to $N_y$ ratio (x:y) of 0.75 or less. For example, it has been observed that $Si_3N_4$ provides the sufficient amount of insulation required by the present invention.

The insulative layer 710 may be formed using a conventional deposition process. In one exemplary embodiment of the present invention, the blanket layer of insulative material 320 is deposited using a LPCVD process using similar gasses, flow rates, pressures, temperatures and energies as used to form the first insulative layer 320. Different deposition conditions, however, could be used to form different types or stoichiometries of suitable materials.

Figure 8:
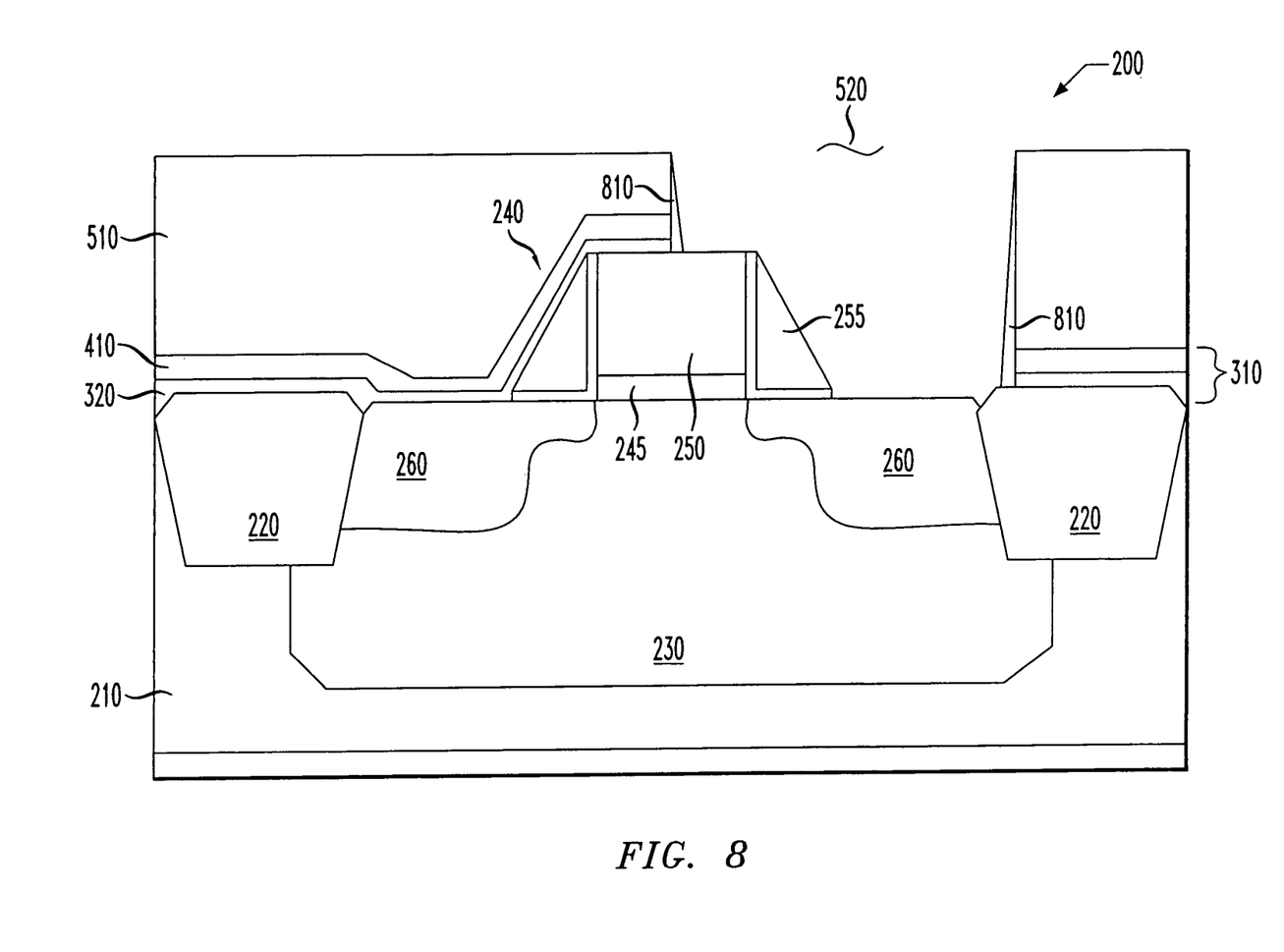
FIG. 8 illustrates a cross-sectional view of the partially completed semiconductor device illustrated in FIG. 7 after anisotropically etching the insulative layer.

Turning now to FIG. 8, illustrated is a cross-sectional view of the partially completed semiconductor device 200 illustrated in FIG. 7 after anisotropically etching the insulative layer 710. The conventional anisotropic etch causes the insulative layer 710 located on horizontal surfaces, or surfaces with a horizontal component, to be removed. What results are insulative spacers 810 located along the sidewalls of the opening 520. The insulative spacers 810 are particularly positioned along a sidewall of the opening 520 proximate the exposed portions of the silicon-rich nitride layer 410. After forming the insulative spacers 810, a conventional conductive plug would be positioned within the opening 520, resulting in a semiconductor device similar to the semiconductor device 100 illustrated in FIG. 1. Thereby, the insulative spacers 810 effectively isolate the silicon-rich nitride layer 410 from the conductive plug.

Figure 9:
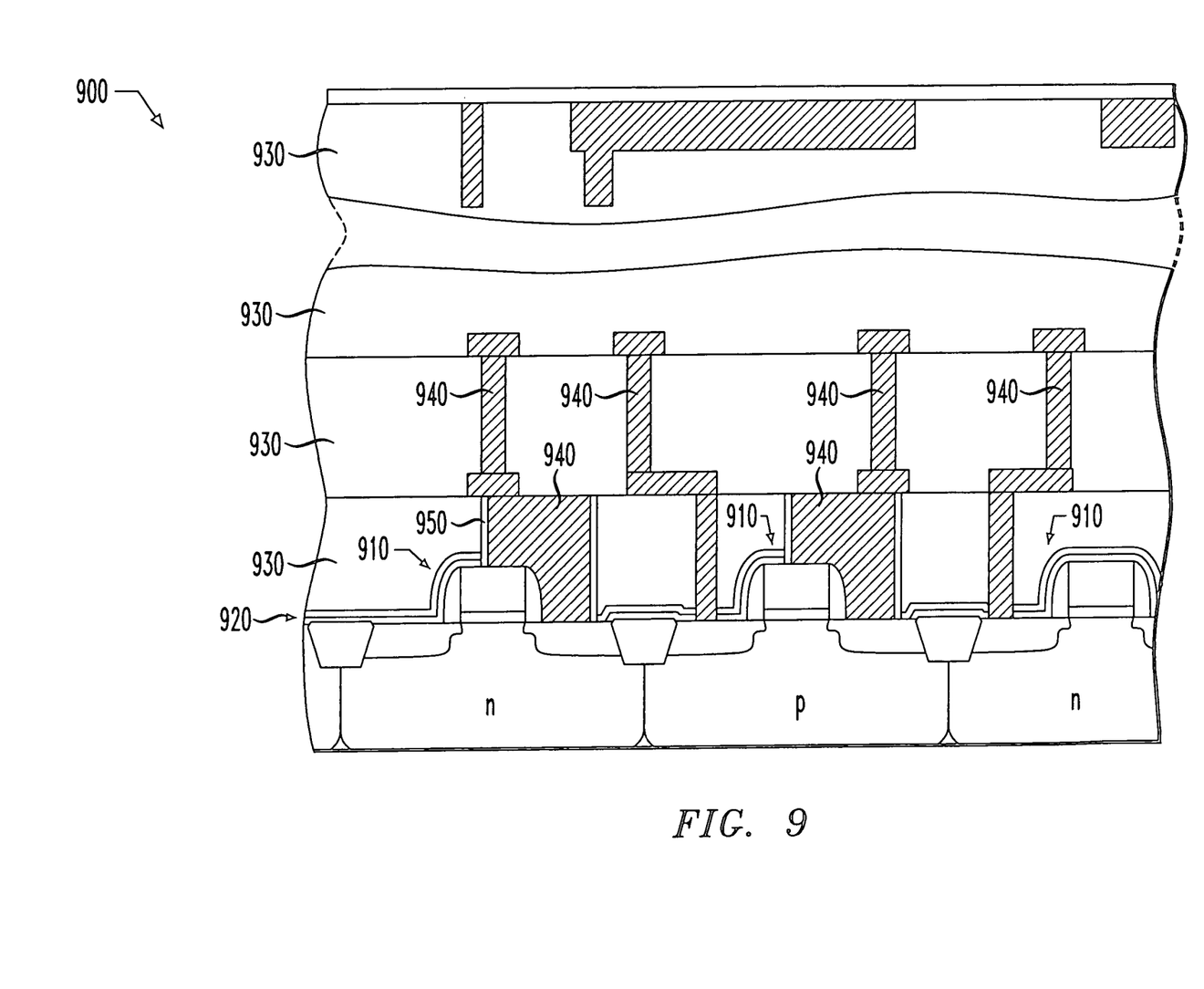
FIG. 9 illustrates a cross-sectional view of a conventional integrated circuit (IC) incorporating semiconductor devices constructed according to the principles of the present invention.

Referring finally to FIG. 9, illustrated is a cross-sectional view of a conventional integrated circuit (IC) 900 incorporating semiconductor devices 910 constructed according to the principles of the present invention. The IC 900 may include devices, such as transistors used to form CMOS devices, BiCMOS devices, Bipolar devices, or other types of devices. The IC 900 may further include passive devices, such as inductors or resistors, or it may also include optical devices or optoelectronic devices. Those skilled in the art are familiar with these various types of devices and their manufacture.

In the particular embodiment illustrated in FIG. 9, the IC 900 includes semiconductor devices 910 having a multi layer etch stop 920 located over portions thereof. Similarly, the IC 900 further includes dielectric layers 930 located over the semiconductor devices 910 and having conductive plugs 940 located therein. Uniquely positioned between at least a portion of the conductive plugs 940 and the multi layer etch stop 920, are insulative spacers 950.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a multi layer etch stop located over a substrate, wherein said multi layer etch stop has a first insulative layer and a second silicon-rich nitride layer located over said first insulative layer;
   a dielectric layer located over said multi layer etch stop, said dielectric layer having an opening formed therein that extends through at least a portion of said multi layer etch stop;
   a conductive plug located within said opening; and
   an insulative spacer located between said conductive plug and said second silicon-rich nitride layer, wherein a thickness of said insulative spacer tapers as said insulative spacer approaches said second silicon-rich nitride layer.

2. The semiconductor device as recited in claim 1 wherein said first insulative layer is a first silicon nitride portion.

3. The semiconductor device as recited in claim 2 wherein said first silicon nitride portion has a $Si_x$ to $N_y$ ratio (x:y) of .75 or less and said second silicon-rich nitride layer has a $Si_x$ to $N_y$ ratio (x:y) of greater than about 1.0.

4. The semiconductor device as recited in claim 3 wherein said second silicon-rich nitride layer is pure silicon.

5. The semiconductor device as recited in claim 1 wherein said insulative spacer is a silicon nitride insulative spacer.

6. The semiconductor device as recited in claim 5 wherein said silicon nitride insulative spacer has a $Si_x$ to $N_y$ ratio (x:y) of .75 or less.

7. The semiconductor device as recited in claim 1 wherein said insulative spacer has a maximum thickness ranging from about 10 nm to about 30 nm.

* * * * *